United States Patent
He et al.

(10) Patent No.: US 12,507,476 B2
(45) Date of Patent: Dec. 23, 2025

(54) DISPLAY PANEL AND DISPLAY DEVICE

(71) Applicant: Xiamen Tianma Micro-Electronics Co., Ltd., Xiamen (CN)

(72) Inventors: Shui He, Xiamen (CN); Ping An, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 885 days.

(21) Appl. No.: 17/534,459

(22) Filed: Nov. 24, 2021

(65) Prior Publication Data
US 2022/0085074 A1    Mar. 17, 2022

(30) Foreign Application Priority Data
Dec. 30, 2020    (CN) .......................... 202011613598.3

(51) Int. Cl.
     *H10D 86/60*    (2025.01)
     *H10D 86/40*    (2025.01)

(52) U.S. Cl.
     CPC .......... *H10D 86/60* (2025.01); *H10D 86/423* (2025.01)

(58) Field of Classification Search
     CPC .. H01L 27/1251; H10D 86/60; H10D 86/423; H10D 86/451; H10D 86/471; H10D 86/431; H10D 86/425; H10K 59/1213
     See application file for complete search history.

(56) References Cited

U.S. PATENT DOCUMENTS

| | | | | |
|---|---|---|---|---|
| 5,880,967 | A  * | 3/1999 | Jyu ...................... | G06F 30/327 |
| | | | | 716/133 |
| 2006/0063298 | A1* | 3/2006 | Winters ............... | G09G 3/3241 |
| | | | | 257/E27.111 |
| 2012/0007158 | A1 | 1/2012 | Yoon et al. | |
| 2016/0284733 | A1* | 9/2016 | Lee ........................ | H10D 86/60 |
| 2018/0006102 | A1* | 1/2018 | Oh ........................ | G09G 3/3233 |
| 2019/0267441 | A1* | 8/2019 | Lee ....................... | H10D 86/421 |
| 2020/0350341 | A1* | 11/2020 | Hanada ............... | H10D 86/471 |

(Continued)

FOREIGN PATENT DOCUMENTS

CN      110931508 A      3/2020

OTHER PUBLICATIONS

Tomita, S., Jurichich, S. and Saraswat, K.C., Transistor sizing for AMLCD integrated TFT drive circuits. Journal of the Society for Information Display, 5: 399-404. https://doi.org/10.1889/1.1985187 (Year: 1997).*

*Primary Examiner* — Yara B Green
*Assistant Examiner* — Coralie A Nettles
(74) *Attorney, Agent, or Firm* — ALSTON & BIRD LLP

(57) ABSTRACT

Provided are a display panel and a display device. The display panel includes a base substrate, a first transistor, and a second transistor. The first transistor and the second transistor are formed on the base substrate, the first transistor includes a first active layer, a first gate, a first source, and a first drain, and the first active layer comprises silicon; the second transistor includes a second active layer, a second gate, a second source, and a second drain, and the second active layer comprises an oxide semiconductor and is disposed on one side of the first active layer facing away from the base substrate. In a first direction perpendicular to the base substrate, a first distance between the first gate and the first active layer is D1, a second distance between the second gate and the second active layer is D2, and D1<D2.

15 Claims, 10 Drawing Sheets

(56) References Cited

U.S. PATENT DOCUMENTS

| | | | |
|---|---|---|---|
| 2020/0395425 A1* | 12/2020 | Han | H10K 59/126 |
| 2021/0399074 A1* | 12/2021 | Moon | H10D 30/6757 |
| 2022/0085128 A1* | 3/2022 | Lius | H10D 30/6723 |
| 2022/0302233 A1* | 9/2022 | Liu | H10K 59/65 |
| 2023/0007770 A1* | 1/2023 | Takemasa | H01L 25/0753 |

* cited by examiner

DISPLAY PANEL AND DISPLAY DEVICE

CROSS-REFERENCES TO RELATED APPLICATIONS

This application claims the priority to a Chinese patent application No. CN 202011613598.3 filed at the CNIPA on Dec. 30, 2020, the disclosure of which is incorporated herein by reference in its entirety.

TECHNICAL FIELD

Embodiments of the present disclosure relate to the field of display technologies and, in particular, to a display panel and a display device.

BACKGROUND

With the development of science and technology, more and more electronic devices with a display function are widely applied to and bring great convenience for people's daily lives and work. Such devices have now become indispensable and important tools for people.

A display panel is an important component of an electronic device for implementing the display function. The display panel generally includes a pixel circuit and a drive circuit providing a drive signal for the pixel circuit. Transistors are provided in both the pixel circuit and the drive circuit. Indium gallium zinc oxide (IGZO) is often used as an active layer in a transistor to reduce the leakage current in the transistor. However, IGZO materials are sensitive to hydrogen and water and oxygen content in the external environment. Therefore, when the IGZO materials are used as materials of the active layer in a transistor in the pixel circuit and/or the drive circuit, the IGZO active layer may be eroded by hydrogen, water and oxygen, and the like in an organic film layer in the display panel. Thus, the performance of the IGZO transistor is affected, and the performance of the drive circuit and/or the pixel circuit is further affected.

SUMMARY

In view of the above, a display panel and a display device are provided in the embodiments of the present disclosure to solve the problem in the related art that the performance of the IGZO transistor is affected and the performance of the drive circuit and/or the pixel circuit is further affected.

In one aspect, a display panel is provided in the embodiments of the present disclosure. The display panel includes a base substrate, a first transistor, and a second transistor.

The first transistor and the second transistor are formed on the base substrate. The first transistor includes a first active layer, a first gate, a first source and a first drain, and the first active layer includes silicon. The second transistor includes a second active layer, a second gate, a second source, and a second drain, and the second active layer includes an oxide semiconductor and is disposed on one side of the first active layer facing away from the base substrate.

In a direction perpendicular to the base substrate, a distance between the first gate and the first active layer is D1, a distance between the second gate and the second active layer is D2, and D1<D2.

The display panel includes a pixel circuit and a drive circuit providing a drive signal for the pixel circuit, where the drive circuit includes the second transistor, and the pixel circuit includes the first transistor or the drive circuit includes the first transistor.

In another aspect, a display device is further provided in the embodiments of the present disclosure. The display device includes the preceding display panel.

The display panel provided in the embodiments of the present disclosure includes the first transistor and the second transistor. The first active layer of the first transistor includes silicon, the second active layer of the second transistor contains the oxide semiconductor, and the second active layer is located on the side of the first active layer facing away from the base substrate. The distance between the first gate and the first active layer is smaller than the distance between the second gate and the second active layer, so that the second active layer can be protected from being eroded by hydrogen and water and oxygen and ensured to have a good performance and meanwhile the migration performance of carriers in the first transistor is ensured to further ensure a good performance of the first transistor. Thus, the effect of improving the performance of the drive circuit and the performance of the pixel circuit is achieved.

BRIEF DESCRIPTION OF DRAWINGS

Other features, objects and advantages of the present application will become more apparent after a detailed description of non-limiting embodiments with reference to the drawings below is read.

DETAILED DESCRIPTION

Figure 1:
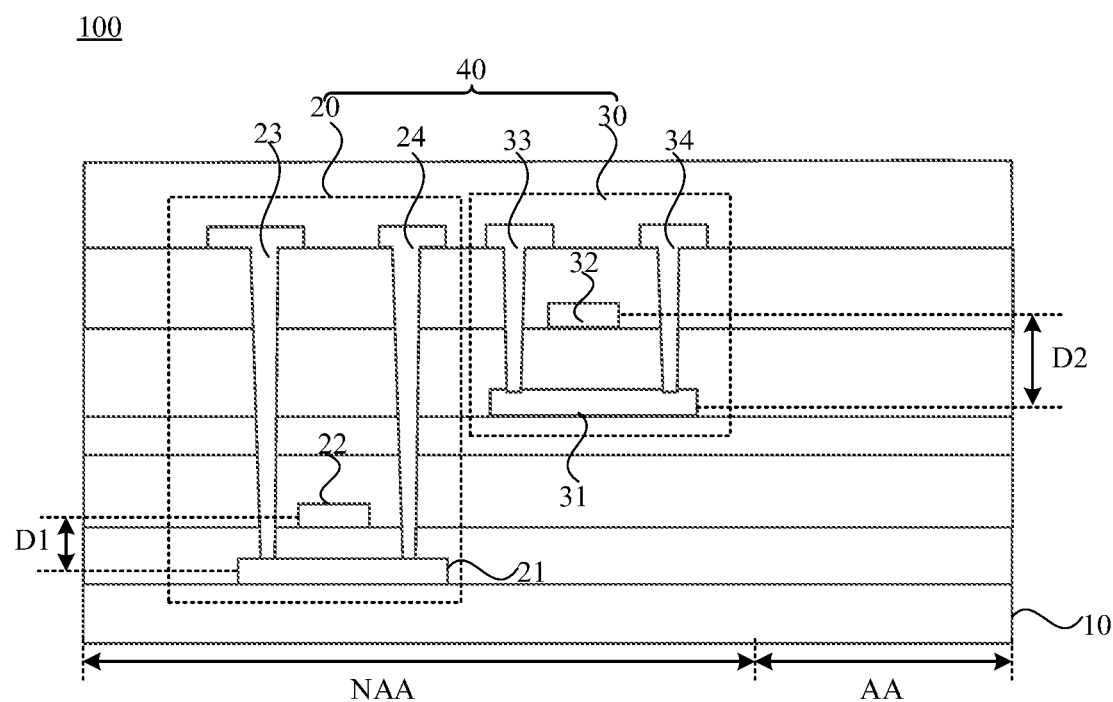
FIG. 1 is a diagram showing structures of a film layer of a display panel according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

FIG. 1 is a diagram showing structures of a film layer of a display panel according to an embodiment of the present disclosure. As shown in FIG. 1, a display panel 100 provided in the embodiments of the present disclosure includes a base substrate 10, a first transistor 20, and a second transistor 30. The first transistor 20 and the second transistor 30 are formed on the base substrate 10, the first transistor 20 includes a first active layer 21, a first gate 22, a first source 23, and a first drain 24, and the first active layer 21 includes silicon. The second transistor 30 includes a second active layer 31, a second gate 32, a second source 33, and a second drain 34. The second active layer 31 includes an oxide semiconductor and is disposed on one side of the first active layer 21 facing away from the base substrate 10. FIG. 1 is illustrated by using an example in which the first transistor 20 and the second transistor 30 are each a top-gate transistor. That is, the first gate 22 is located on the side of the first active layer 21 facing away from the substrate 10, and the second gate 32 is located on the side of the second active layer 31 facing away from the base substrate 10. In addition, the first source 23 and the first drain 24 in the first transistor 20 and the second source 33 and the second drain 34 in the second transistor 30 shown in FIG. 1 are disposed in the same film layer. That is, the first source 23, the first drain 24, the second source 33, and the second drain 34 are formed by using the same process. In this manner, the process steps can be simplified and the manufacturing efficiency of the display panel can be improved. However, it is to be understood that the specific film-layer positional relationship of the first transistor 20 and the second transistor 30 is not limited to that shown in FIG. 1 and can be set by those skilled in the art according to an actual situation.

In a direction perpendicular to the base substrate 10, D1 denotes a distance between the first gate 22 and the first active layer 21, D2 denotes a distance between the second gate 32 and the second active layer 31 is D2, and D1<D2. The display panel 100 includes a pixel circuit (not shown in FIG. 1) and a drive circuit 40 providing a drive signal for the pixel circuit. The drive circuit 40 includes the second transistor 30, and the pixel circuit includes the first transistor 20 or the drive circuit 40 includes the first transistor 20. FIG. 1 is illustrated by using an example in which the drive circuit 40 includes the first transistor 20.

It is to be noted that in the present disclosure, the first transistor 20 and the second transistor 30 may be transistors in the drive circuit, that is, the drive circuit 40 includes the first transistor 20 or the second transistor 30. Furthermore, the first transistor 20 and the second transistor 30 may be transistors in the pixel circuit, that is, the pixel circuit includes the first transistor 20 or the second transistor 30, for example, when the second transistor 30 is located in the pixel circuit, the second transistor 30 may be a drive transistor or a switch transistor.

Figure 2:
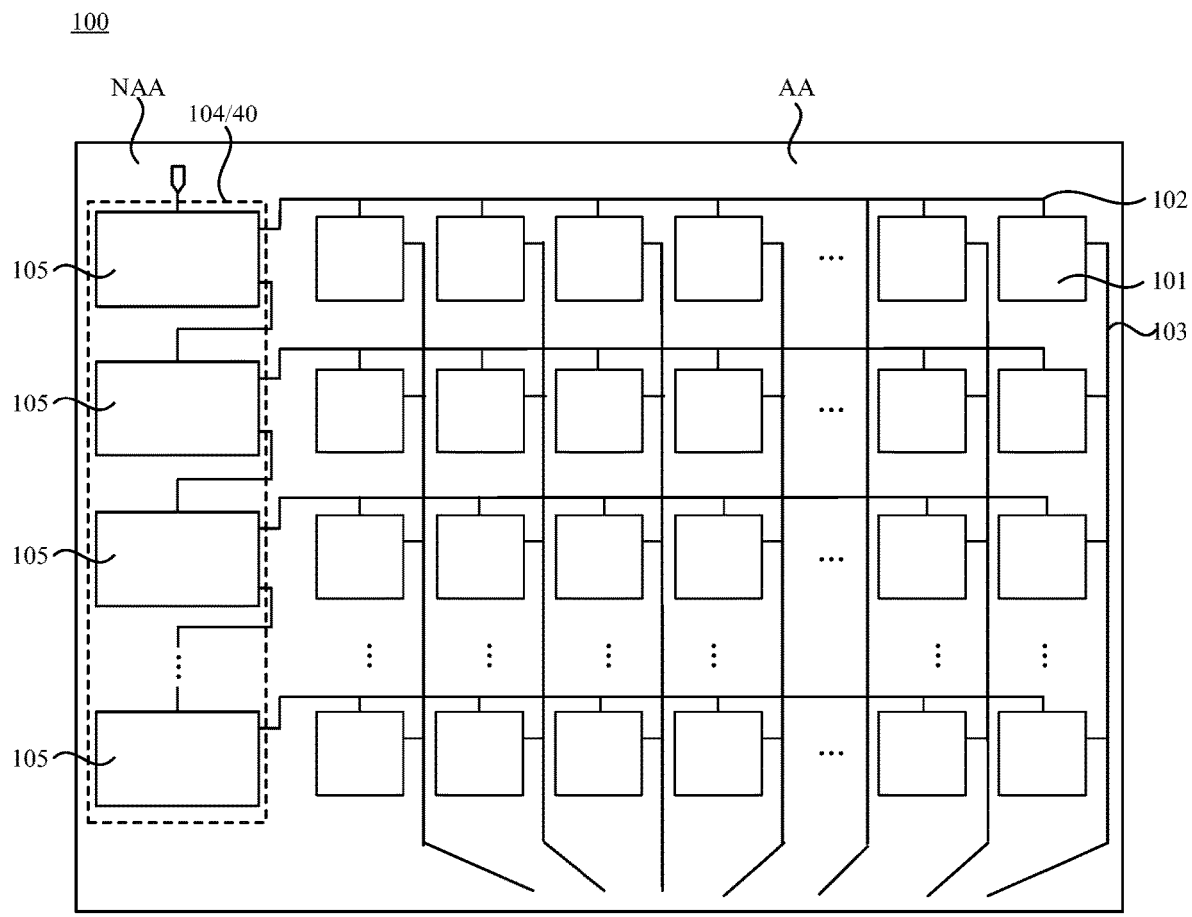
FIG. 2 is a diagram showing structures of a display panel according to an embodiment of the present disclosure.

Exemplarily, FIG. 2 is a diagram showing structures of a display panel according to an embodiment of the present disclosure. As shown in FIG. 2, the display panel 100 includes a display region AA and a non-display region NAA. The non-display region NAA is located on at least one side of the display region AA. FIG. 2 is illustrated by using an example in which the non-display region NAA is located on one side of the display region AA. The display region AA includes a plurality of sub-pixels 101 arranged in an array and also includes scanning lines 102 and data lines 103 which intersect to define the plurality of sub-pixels 101. Each sub-pixel 101 includes a pixel circuit (not shown in FIG. 2). The non-display region NAA is used for arranging the drive circuit 40. The drive circuit 40 may include, for example, at least one of a scanning drive circuit or a light emission control drive circuit. FIG. 2 is illustrated by using an example in which the drive circuit 40 is a scanning drive circuit 104. As shown in FIG. 2, the scanning drive circuit 104 includes a plurality of scanning drive units 105 arranged in cascade. When one frame of picture is displayed on the display panel 100, the plurality of scanning drive units 105 arranged in cascade sequentially input a corresponding scanning signal to each scanning line 102 of the display panel 100 so that the data signal can be written into a corresponding sub-pixel 101 in the display region AA through a corresponding data line 103.

Figure 3:
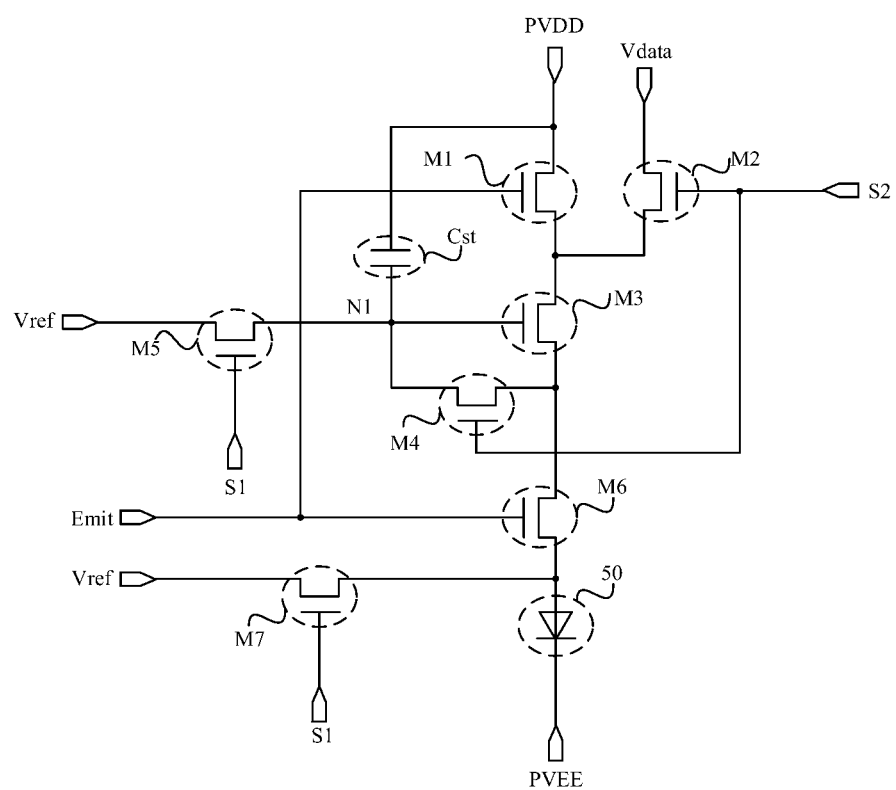
FIG. 3 is a diagram showing structures of a pixel circuit according to an embodiment of the present disclosure.

It is to be noted that the specific structure of the drive circuit 40 may be set according to the structure of the pixel circuit. For example, the pixel circuit may include a 2T1C pixel circuit, a 7T1C pixel circuit or the like, which is not limited in this embodiment. When the pixel circuit includes the 2T1C pixel circuit, the drive circuit 40 may include, for example, merely the scanning drive circuit, and the light emission control drive circuit is not required to be disposed in this case. When the pixel circuit includes the 7T1C pixel circuit, the drive circuit 40 may include, for example, the scanning drive circuit and may further include the light emission control drive circuit and the like. Exemplarily, FIG. 3 is a diagram showing structures of a pixel circuit according to an embodiment of the present disclosure. As shown in FIG. 3, when the pixel circuit is the 7T1C pixel circuit, the pixel circuit includes light emission control transistors (M1 and M6), a data write transistor M2, a drive transistor M3, a threshold compensation transistor M4, reset transistors (M5 and M7), and a storage capacitor Cst. In this case, the drive circuit 40 may include the scanning drive circuit and the light emission control drive circuit. The drive signal provided by the drive circuit 40 for the pixel circuit may include, for example, a light emission control signal Emit (output from the light emission control drive circuit) and scanning signals S1 and S2 (output from the scanning drive circuit). The light emission control signal Emit controls the light emission control transistors (M1 and M6) to turn on or off, the scanning signal S1 controls the reset transistors (M5 and M7) to turn on or off, and the scanning signal S2 controls the data write transistor M2 and the threshold compensation transistor M4 to turn on or off. The driving process of the pixel circuit driving a light-emitting element 50 in FIG. 3 is, for example, as described below. In a reset stage, the scanning signal S1 provided by the drive circuit 40 enables the reset transistors (M5 and M7) in the pixel circuit to turn on to reset an N1 node and the anode of the light-emitting element 50. In a data write stage, the drive circuit 40 provides the scanning signal S2 so that the data write transistor M2 and the threshold compensation transistor M4 in the pixel circuit are turned on, and at this time, a data signal Vdata can write a data voltage into the storage capacitor Cst. In a light emission stage, the light emission control signal Emit provided by the drive circuit 40 enables the light emission control transistors (M1 and M6) in the pixel circuit to turn on to drive, through the drive transistor M3, the light-emitting element 50 to emit light.

The scanning drive circuit and/or the light emission control drive circuit in the drive circuit 40 may include, for example, a plurality of transistors, and the transistors inside the drive circuit 40 are controlled to turn on or off through corresponding signals such as clock signals, so that corresponding light emission control signal Emit and/or scanning signals S1 and S2 are output. In this embodiment, the specific structure of the drive circuit 40 is not limited.

In this embodiment, the first active layer 21 in the first transistor 20 contains silicon, optionally poly-silicon, that is, the first active layer 21 is a poly-silicon active layer such as a low temperature poly-silicon (LTPS) active layer. The second active layer 31 in the second transistor 30 includes an oxide semiconductor, that is, the second active layer 31 is an oxide semiconductor active layer such as an IGZO active layer. The LTPS thin-film transistor has the advantages of high carrier mobility, fast response, and low power consumption, and the oxide semiconductor thin-film transistor has the advantage of low leakage current. When the drive circuit 40 includes the first transistor 20 and the second transistor 30, the drive circuit 40 has the advantages of high carrier mobility, fast response, low power consumption, and low leakage current, thereby ensuring the good performance of the drive circuit 40 and improving the display performance of the display panel 100.

Further, in this embodiment, the distance D1 between the first gate 22 and the first active layer 21 is smaller than the distance D2 between the second gate 32 and the second active layer 31. On one hand, the distance between the second gate 32 and the second active layer 31 is larger, that is, the insulating layer between the second gate 32 and the second active layer 31 is thicker, so that the second active layer 31 is fully protected from being eroded by hydrogen, water and oxygen and the like in the organic film layer located on the side of the second active layer 31 facing away from the base substrate 10. On the other hand, the distance between the first gate 22 and the first active layer 21 is smaller, so that the mobility of carriers in the first transistor 20 is increased and the response speed of the first transistor 20 is further improved. That is, in this embodiment, the distance between the first gate 22 and the first active layer 21 is smaller than the distance between the second gate 32 and the second active layer 31, so that the second active layer 31 of the second transistor 30 can be fully protected and thus the performance of the second transistor 20 is good and meanwhile the migration performance of carriers in the first transistor 20 is ensured. In this manner, when the drive circuit includes the first transistor 20 and the second transistor 30, the performance of the drive circuit 40 is ensured to be good; and when the pixel circuit includes the first transistor 20, the performance of the pixel circuit is ensured to be good.

In summary, the display panel provided in this embodiment includes the first transistor and the second transistor. The first active layer of the first transistor contains silicon, the second active layer of the second transistor contains the oxide semiconductor, and the second active layer is located on the side of the first active layer facing away from the base substrate. The distance between the first gate and the first active layer is smaller than the distance between the second gate and the second active layer, so that the second active layer can be protected from being eroded by hydrogen and water and oxygen and ensured to have a good performance and meanwhile the migration performance of carriers in the first transistor is ensured to further ensure the good performance of the first transistor. Thus, the effect of improving the performance of the drive circuit and the performance of the pixel circuit is achieved.

The specific structure of the drive circuit in the preceding content is not limited. However, in actual setting, the drive circuit may have many specific structures. The drive circuits having different structures have slightly different working principles. Examples are described below for illustration. It is to be noted that the content described below is not to limit the present application.

Optionally, the drive circuit includes an input module, a logic transmission module, and an output module, the input module is connected between an input terminal and the logic transmission module, and the output module is connected between the logic transmission module and an output terminal. The logic transmission module is connected to a logic high-level signal terminal or a logic low-level signal terminal, and the output terminal is connected to the pixel circuit, the logic transmission module includes the second transistor or the input module includes the second transistor, and the output module includes the first transistor.

As is known from the preceding content, the drive circuit may be the scanning drive circuit that provides a scanning signal for the pixel circuit, may be the light emission control drive circuit that provides a light emission control signal for the pixel circuit, or may be a generic name of the scanning drive circuit that provides a scanning signal for the pixel circuit and the light emission control drive circuit that provides a light emission control signal for the pixel circuit, which is not limited in this embodiment. The driving process of the drive circuit is briefly introduced by exemplarily using an example in which the drive circuit is the scanning drive circuit.

Figure 4:
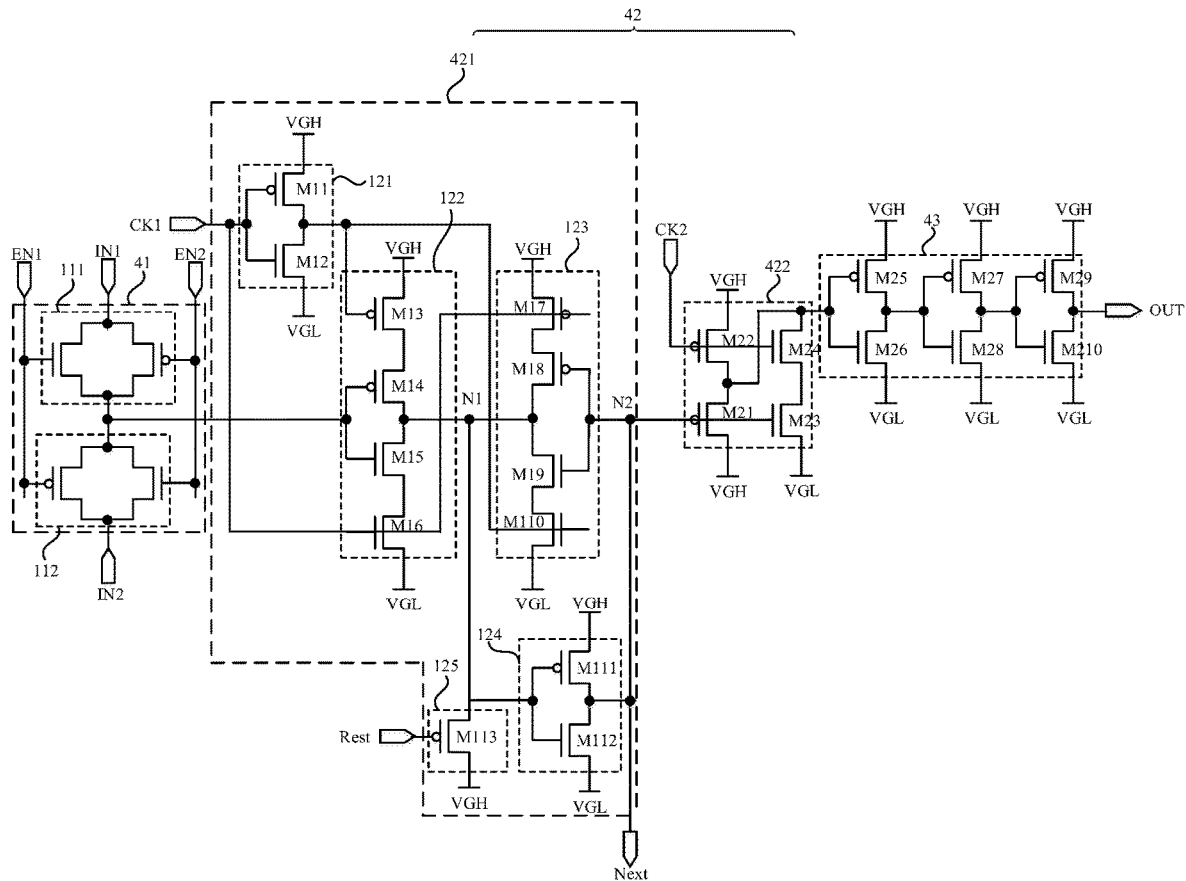
FIG. 4 is a diagram showing structures of a scanning drive unit according to an embodiment of the present disclosure.

Exemplarily, FIG. 4 is a diagram showing structures of a scanning drive unit according to an embodiment of the present disclosure. Referring to FIG. 2 and FIG. 4, the drive circuit 40 includes the scanning drive circuit 104, and the scanning drive circuit 104 includes the plurality of scanning drive units 105 arranged in cascade. The scanning drive unit 105 includes an input module 41, a logic transmission module 42, and an output module 43. The input module 41 is formed by two transmission gates 111 and 112 to control the transmission of the signal of a forward scanning input terminal IN1 or a reverse scanning input terminal IN2 to the logic transmission module 42 according to a forward scanning enable signal of a forward scanning enable terminal EN1 and a reverse scanning enable signal of a reverse scanning enable terminal EN2. The logic transmission module 42 may include, for example, a shift unit 421 and a NAND circuit 422. The shift unit 421 is formed by a first inverter 121, a second inverter 124, a first clock inverter 122, a second clock inverter 123, and a reset unit 125. The input terminal of the first inverter 121 is electrically connected to a first clock signal terminal CK1, and the output terminal of the first inverter 121 is electrically connected to the control terminal of the first clock inverter 122 and the control terminal of the second clock inverter 123 separately. The input terminal of the first clock inverter 122 is electrically connected to the input module 41 and receives a signal of the forward scanning input terminal IN1 or the reverse scanning input terminal IN2 input from the input module 41. The output terminal of the first clock inverter 122 is electrically connected to the input terminal of the second inverter 124, and the clock terminal of the first clock inverter 122 is electrically connected to the first clock signal terminal CK1. The input terminal of the second clock inverter 123 is electrically connected to the output terminal of the second inverter 124, the clock terminal of the second clock inverter 123 is electrically connected to the first clock signal terminal CK1, and the output terminal of the second clock inverter 123 is electrically connected to the input terminal of the second inverter 124. The output terminal of the second inverter 124 is also electrically connected to the output module 13 and a shift signal output terminal Next. The first inverter 121 is formed by a transistor M11 and a transistor M12. When the first clock signal received by the first clock signal terminal CK1 is at a low level, the first inverter 121 outputs a first level signal of a first level signal terminal VGH received by the first electrode of the transistor M11; and when the first clock signal received by the first clock signal terminal CK1 is at a high level, the first inverter 121 outputs a second level signal of a second level signal terminal VGL received by the first electrode of the transistor M12. The first clock inverter 122 is formed by a transistor M13, a transistor M14, a transistor M15, and a transistor M16. When the first clock signal received by the first clock signal terminal CK1 is at a high level and the signal input from the input module 41 is at a high level, the first clock inverter 122 outputs the second level signal of the second level signal terminal VGL received by the first electrode of the transistor M16; and when the signal input from the input module 41 is at a low level and the first inverter 121 outputs the second level signal, the first clock inverter 122 outputs the first level signal of the first level signal terminal VGH received by the first electrode of the transistor M13. The second clock inverter 123 is formed by a transistor M17, a transistor M18, a transistor M19, and a transistor M110. When the first clock signal received by the first clock signal terminal CK1 is at a low level and the second inverter 124 outputs a logic low-level signal, the second clock inverter 123 outputs the first level signal of the first level signal terminal VGH received by the first electrode of the transistor M17; and when the first inverter 121 outputs the first level signal and the second inverter 124 outputs a logic high-level signal, the second clock inverter 123 outputs the second level signal of the second level signal terminal VGL received by the first electrode of the transistor M110. The second inverter 124 is formed by a transistor M111 and a transistor M112. When the logic high-level signal is input to the input terminal of the second inverter 124, the second inverter 124 outputs the second level signal of the second level signal terminal VGL received by the first electrode of the transistor M112; and when the logic low-level signal is input to the input terminal of the second inverter 124, the second inverter 124 outputs the first level signal of the first level signal terminal VGH received by the first electrode of the transistor M111. The control terminal of the reset unit 125 is electrically connected to a reset signal input terminal Rest, the input terminal of the reset unit 125 is electrically connected to the first level signal terminal VGH, and the output terminal of the reset unit 125 is electrically connected to the input terminal of the second inverter 124. The reset unit 125 is formed by a transistor M113 to reset a signal of the input terminal of the second inverter 124 according to a reset signal of the reset signal input terminal Rest. A NAND gate circuit 131 is formed by a transistor M21, a transistor M22, a transistor M23, and a transistor M24, and achieves the NAND function of the second clock signal of the second clock signal terminal CK2 and the shift signal output by the shift unit 421. The output module 43 is formed by three inverters formed by transistors M25, M26, M27, M28, M29, and M210 to transmit a signal output from the NAND gate circuit 422 to a scanning signal output terminal OUT to achieve the output of a scanning signal. As is known from the preceding content and FIG. 4, the input module 41, the logic transmission module 42, and the output module 43 are each formed by a plurality of transistors. In this embodiment, at least one of the transistors in the input module 41 or the logic transmission module 42 is the second transistor. The distance between the second active layer and the second gate of the second transistor is larger, that is, the insulating layer between the second gate and the second active layer is thicker, so that the second active layer is fully protected and the transistor has a low leakage current in the off state, avoiding the influence of the leakage current of the transistor on the high and low levels after the logic transmission and thereby avoiding the influence on the normal transfer of a next node signal. At least one of the transistors in the output module 43 is the first transistor. The distance between the first active layer and the first gate of the first transistor is small, so the transistor in the output module 43 has high response speed and driving capability, thereby ensuring the response and driving capability of the drive circuit and avoiding a problem of signal hysteresis of the display panel caused by the drive circuit. That is, the performance of the drive circuit 40 can be improved through the following setting: at least one of the transistors in the input module 41 or the logic transmission module 42 is the second transistor and at least one of the transistors in the output module 43 is the first transistor.

Optionally, W1 denotes a width of a channel region of the first transistor 20, and W2 denotes a width of a channel region of the second transistor 30, L1 denotes a length of the channel region of the first transistor 20, and L2 denotes a length of the channel region of the second transistor 30. R1 denotes a width-to-length ratio of the first transistor 20 and satisfies R1=W1/L1, R2 denotes a width-to-length ratio of the second transistor 30 and satisfies R2=W2/L2, and R1/R2≥D1/D2.

Figure 5:
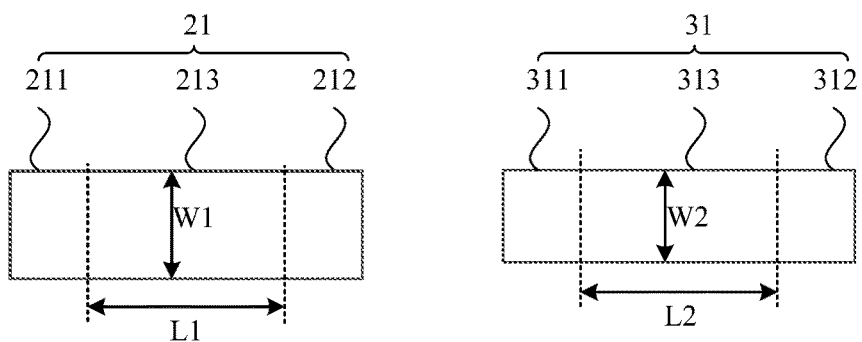
FIG. 5 is a schematic diagram illustrating a structure comparison between a first active layer and a second active layer according to an embodiment of the present disclosure.

Exemplarily, FIG. 5 is a top view illustrating a structure comparison between a first active layer and a second active layer according to an embodiment of the present disclosure. As shown in FIG. 5, the first active layer 21 of the first transistor 20 includes a source region 211 used for disposing the first source 23, a drain region 212 used for disposing the first drain 24, and a channel region 213 being the overlapping part of the first gate 22 and the first active layer 21. The channel region 213 of the first transistor 20 has a width of W1, a length of L1, and a width-to-length ratio R1 of channel region 213 of the first transistor 20 satisfies R1=W1/L1. The second active layer 31 of the second transistor 30 includes a source region 311 used for disposing the second source 33, a drain region 312 used for disposing the second drain 34, and a channel region 313 being the overlapping part of the second gate 32 and the second active layer 31. The channel region 313 of the second transistor 30 has a width of W2, a length of L2, and a width-to-length ratio R2 of channel region 313 of the second transistor 30 satisfies R2=W2/L2. The ratio of the width-to-length ratio of the channel region 213 in the first transistor 20 to the width-to-length ratio of the channel region 313 in the second transistor 30 is greater than the ratio of the distance D1 between the first gate 22 and the first active layer 21 to the distance D2 between the second gate 32 and the second active layer 32, that is, the width-to-length ratio of the channel region 213 in the first transistor 20 is greater, in other words, the channel region 213 of the first transistor 20 is wider, so that the mobility of carriers in the first transistor 20 is increased and the response speed of the first transistor 20 is further increased.

It is to be noted that to clearly compare the width W1 and the length L1 of the channel region 213 of the first active layer 21 in the first transistor 20 with the width W2 and the length L2 of the channel region 213 of the second active layer 31 in the second transistor 30, FIG. 5 merely exemplarily illustrates that the shapes of the first active layer 21 and the second active layer 31 are each a rectangle. In actual setting, the shapes of the first active layer 21 and the second active layer 31 are set according to a situation. Setting in the following embodiment is also same as the configuration described above. Repetition will not be made here.

Figure 6:
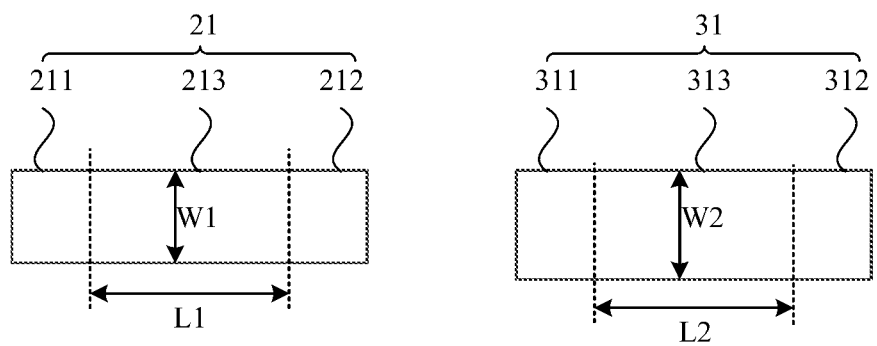
FIG. 6 is a schematic diagram illustrating a structure comparison between a first active layer and a second active layer according to an embodiment of the present disclosure.

Optionally, FIG. 6 is a top view illustrating another structure comparison between a first active layer and a second active layer according to an embodiment of the present disclosure. As shown in FIG. 6, W1 denotes the width of the channel region 213 of the first transistor 20, and W2 denotes the width of the channel region 313 of the second transistor 30. L1 denotes the length of the channel region 213 of the first transistor 20, L2 denotes the length of the channel region 313 of the second transistor 30, and W1/L1≤W2/L2. Such setting has the advantages of increasing the mobility of carriers in the second transistor 30 and increasing the response speed of the second transistor 30, so that not only the second active layer 31 in the second transistor 30 can be prevented from being eroded by hydrogen, water and oxygen and the like in the organic film layer located on the side of the second active layer 32 facing away from the base substrate 10 to improve the performance of the second transistor 30 but also the response speed of the second transistor 30 is ensured.

On the basis of the preceding solution, optionally, with continued reference to FIG. 4 and FIG. 6, the width-to-length ratio of the channel region of the first transistor is R1=W1/L1, the width-to-length ratio of the channel region of the second transistor is R2=W2/L2, and R1/R2≤D1/D2. The drive circuit 40 includes the input module 41, the logic transmission module 42, and the output module 43, the input module 41 is connected between an input terminal and the logic transmission module 42, and the output module 43 is connected between the logic transmission module 42 and an output terminal. The logic transmission module 42 is connected to a logic high-level signal terminal or a logic low-level signal terminal, and the output terminal is connected to the pixel circuit 60; and the output module 43 includes the second transistor 30.

In this embodiment, the ratio of the width-to-length ratio of the channel region 213 in the first transistor 20 to the width-to-length ratio of the channel region 313 in the second transistor 30 is less than the ratio of the distance D1 between the first gate 22 and the first active layer 21 to the distance D2 between the second gate 32 and the second active layer 32, that is, the channel region 313 of the second transistor 30 is wider, so that the mobility of carriers in the second transistor 30 is increased and the response speed of the second transistor 30 is further increased. In this manner, when the output module 43 includes the second transistor 30, it can also be ensured that the output module 43 has high response speed and driving capability, thereby ensuring the response and driving capability of the drive circuit and avoiding a problem of signal hysteresis of the display panel caused by the drive circuit.

It is to be noted that for the width and length of the channel region described herein, the length of the channel region refers to a size in a direction in which carriers in the channel region migrate between a source and a drain; and if the direction is defined as a second direction, the width of the channel region refers to a size of the channel region in a third direction, where the second direction may be perpendicular to the third direction.

Figure 7:
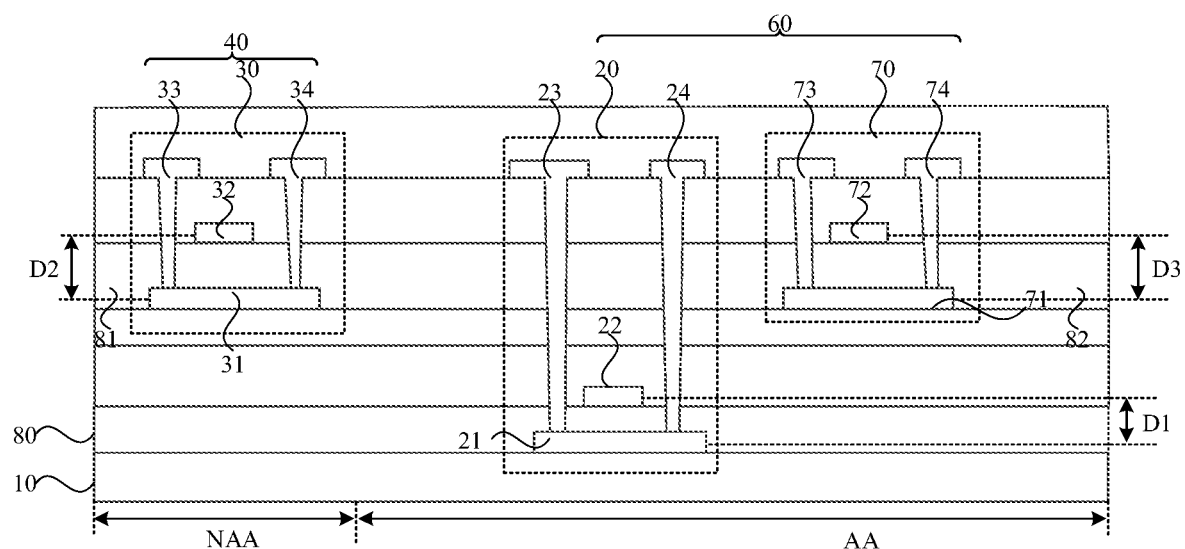
FIG. 7 is a diagram showing structures of a film layer of another display panel according to an embodiment of the present disclosure.

Optionally, FIG. 7 is a diagram showing structures of a film layer of another display panel according to an embodiment of the present disclosure. As shown in FIG. 7, the pixel circuit 60 includes a third transistor 70, the third transistor 70 includes a third active layer 71, a third gate 72, a third source 73, and a third drain 74, and the third active layer 71 contains an oxide semiconductor. In the direction perpendicular to the base substrate 10, a distance between the third gate 72 and the third active layer 71 is D3, and D1<D3. FIG. 3 is illustrated by using an example in which the pixel circuit 60 includes the first transistor 20.

Exemplarily, as shown in FIG. 7, the display panel 100 includes a display region AA and a non-display region NAA, the drive circuit 40 is located in the non-display region NAA, and the pixel circuit 60 is located in the display region AA. The pixel circuit 60 includes the first transistor 20 and the third transistor 70. The third active layer 71 in the third transistor 70 includes an oxide semiconductor, that is, the third active layer 71 is an oxide semiconductor active layer such as an IGZO active layer. The leakage current of the oxide semiconductor thin-film transistor is very low, which can ensure that the leakage current in the working process of the pixel circuit 60 is low. The first active layer 21 in the first transistor 20 contains silicon, optionally poly-silicon, that is, the first active layer 21 is a poly-silicon active layer such as a low temperature poly-silicon (LTPS) active layer. Furthermore, the LTPS thin-film transistor has the advantages of high carrier mobility, fast response, and low power consumption. Therefore, when the pixel circuit 60 includes the first transistor 20 and the third transistor 70, the pixel circuit 60 has the advantages of high carrier mobility, fast response, low power consumption, and low leakage current, thereby ensuring the good performance of the pixel circuit 60 and improving the display performance of the display panel 100. In addition, in this embodiment, the second transistor 30 in the drive circuit 40 is an oxide semiconductor transistor and the third transistor 70 in the pixel circuit 60 is an oxide semiconductor transistor, so that the leakage current in the working process of the drive circuit 40 and the pixel circuit 60 is ensured to be low, the drive circuit 40 and the pixel circuit 60 thus have good performance, and the display performance of the display panel 100 is further improved.

Further, in this embodiment, the distance D1 between the first gate 22 and the first active layer 21 is smaller than the distance D3 between the third gate 72 and the third active layer 71. On one hand, the distance between the third gate 72 and the third active layer 71 is larger, that is, the insulating layer between the third gate 72 and the third active layer 71 is thicker, so that the third active layer 71 is fully protected from being eroded by hydrogen, water and oxygen and the like in the organic film layer located on the side of the third active layer 71 facing away from the base substrate 10. On the other hand, the distance between the first gate 22 and the first active layer 21 is smaller, so that the mobility of carriers in the first transistor 20 is increased and the response speed of the first transistor 20 is further improved. That is, in this embodiment, the distance between the first gate 22 and the first active layer 21 is smaller than the distance between the third gate 72 and the third active layer 71, so that the third active layer 71 of the third transistor 70 can be fully protected and thus the performance of the third transistor 70 is good and meanwhile the migration performance of carriers in the first transistor 20 is ensured. In this manner, when the pixel circuit 60 includes the first transistor 20 and the third transistor 70, the performance of the pixel circuit 60 is ensured to be good.

It is to be noted that the third gate 72 may be disposed in the same layer as the second gate 32, and the second active layer 31 may be disposed in the same layer as the third active layer 71. In this case, the distance D2 between the second gate 32 and the second active layer 31 is the same as the distance D3 between the third gate 72 and the third active layer 31; alternatively, the third gate 72 and the second gate 32 are located in different film layers, and the second active layer 31 and the third active layer 71 are located in different film layers. When the third gate 72 may be disposed in the same layer as the second gate 32, and the second active layer 31 may be disposed in the same layer as the third active layer 71, the process steps can be simplified. FIG. 7 is illustrated by using an example in which the third gate 72 is disposed in the same layer as the second gate 32 and the second active layer 31 is disposed in the same layer as the third active layer 71. In addition, in this embodiment, the third source 73 and the third drain 74 in the third transistor 70 are disposed in the same layer as the second source 33 and the second drain 34 in the second transistor 30 and the first source 23 and the first drain 24 in the first transistor 20, thereby simplifying the process steps and improving the manufacturing efficiency of the display panel.

Figure 8:
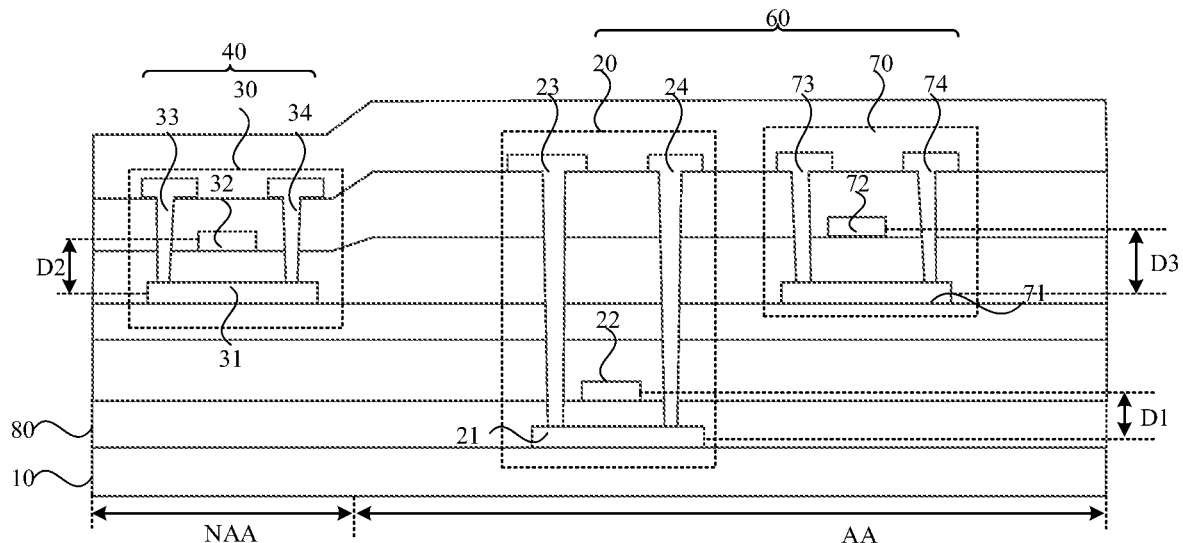
FIG. 8 is a diagram showing structures of a film layer of another display panel according to an embodiment of the present disclosure.

FIG. 8 is a diagram showing structures of a film layer of another display panel according to an embodiment of the present disclosure. On the basis of the preceding embodiment, optionally, as shown in FIG. 8, the third transistor 70 is a switch transistor of the pixel circuit 60, and D2≤D3.

Generally speaking, in a pixel circuit, a transistor having the gate connected to a scanning signal or a light emission control signal is a switch transistor, transistors except the switch transistor in the pixel circuit are drive transistors which are connected in series on the transmission path between a first power signal (e.g. PVDD signal) and a second power signal (e.g. PVEE signal), and a data signal is written into the gate of the drive transistor. As the data signal is written, the potential of the gate the drive transistor changes.

That the pixel circuit is a 7T1C pixel circuit is still used as an example. With continued reference to FIG. 3, the 7T1C pixel circuit includes the light emission control transistors (M1 and M6), the data write transistor M2, the drive transistor M3, the threshold compensation transistor M4, the reset transistors (M5 and M7), and the storage capacitor Cst. Transistors except the drive transistor M3 are all switch transistors including the light emission control transistors (M1 and M6), the data write transistor M2, the threshold compensation transistor M4, and the reset transistors (M5 and M7).

The pixel circuit 60 is sometimes applied to a low-frequency driving mode. When the pixel circuit 60 is applied to the low-frequency driving mode, a switch transistor in the pixel circuit 60 is turned off for a long time, while a transistor in the drive circuit 40 turns on more frequently. Referring to FIG. 8, the distance D3 between the third active layer 31 and the third gate 72 in the third transistor 70 is greater than and equal to the distance D2 between the second active layer 21 and the second gate 32 in the second transistor 30. On one hand, the distance between the third gate 72 and the third active layer 71 is larger, that is, the insulating layer between the third gate 72 and the third active layer 71 is thicker, so that the third active layer 71 is protected and the third transistor 70 is ensured to maintain a low leakage current and stability in the off state for a long time. On the other hand, the distance between the second gate 32 and the second active layer 31 is smaller, so that the mobility of carriers in the second transistor 30 is increased and the response speed when the second transistor in the drive circuit 40 turns on frequently is ensured. Thus, the performance of the drive circuit 40 and the pixel circuit 40 are improved.

It is to be understood that when the third gate 72 and the second gate 32 are located in the same film layer, and the third active layer 71 and the second active layer 31 are located in the same film layer, the insulating layer between the third gate 72 and the second gate 32 and the insulating layer between the third active layer 71 and the second active layer 31 are the same insulating layer. In this case, for example, a Halftone Mask technique can be used so that the thickness of different regions of the insulating layer is different. Of course, the method of making the thickness of different regions of the insulating layer different is not limited to the Halftone Mask technique. The present disclosure is not limited to the fact that the third gate 72 and the second gate 32 are located in the same film layer and the third active layer 71 and the second active layer 31 are located in the same film layer.

Optionally, the third transistor 70 is a drive transistor of the pixel circuit 60, and D2<D3.

If the third transistor 70 is the drive transistor of the pixel circuit 60, the subthreshold swing of the drive transistor cannot be too low since the drive transistor undertakes the function of data writing in the pixel circuit 60 and the threshold capture of the drive transistor is involved in a data writing process. The distance between the third active layer 71 and the third gate 72 is larger, so that the subthreshold swing of the third transistor 70 is ensured to be large, and the third transistor 70 is ensured to slowly perform a threshold capture process; and meanwhile, the distance between the second gate 32 and the second active layer 31 is smaller, so that the mobility of carriers in the second transistor 30 is increased to ensure the response speed of the second transistor 30 in the drive circuit 40, thereby improving the performance of the drive circuit 40 and the pixel circuit 60.

Figure 9:
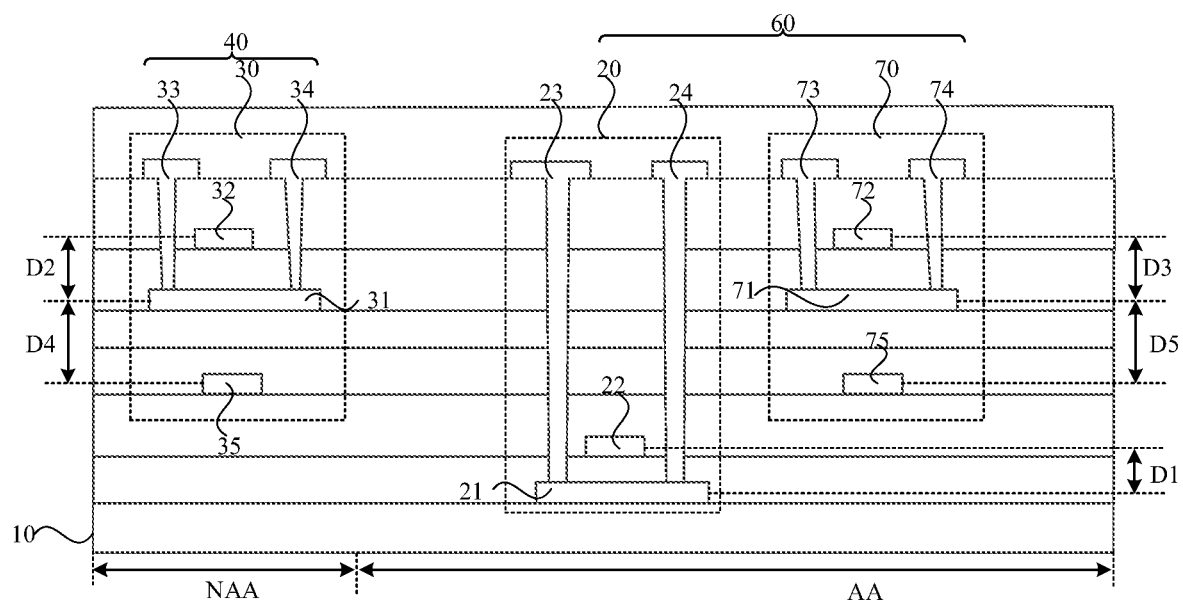
FIG. 9 is a diagram showing structures of a film layer of another display panel according to an embodiment of the present disclosure.

Optionally, FIG. 9 is a diagram showing structures of a film layer of another display panel according to an embodiment of the present disclosure. As shown in FIG. 9, the second gate 32 is located on the side of the first active layer 21 facing away from the base substrate 10, and the third gate 72 is disposed on one side of the third active layer 71 facing away from the base substrate 10. The second transistor 30 includes a fourth gate 35, the third transistor 70 includes a fifth gate 75, the fourth gate 35 is disposed on one side of the second active layer 31 facing towards the base substrate 10, and the fifth gate 75 is disposed on one side of the third active layer 71 facing towards the base substrate 10. In the direction perpendicular to the base substrate 10, a distance between the fourth gate 35 and the second active layer 31 is D4, a distance between the fifth gate 75 and the third active layer 71 is D5, D1<D4, and D1<D5.

Specifically, the second transistor 30 includes not only the second gate 32 but also the fourth gate 35, that is, the second transistor 30 is a double-gate transistor, so that the mobility of carriers in the second transistor 30 can be enhanced, and the response capability of the second transistor 30 can be enhanced. The third transistor 70 includes not only the third gate 72 but also the fifth gate 75, that is, the third transistor 70 is also a double-gate transistor, so that the mobility of carriers in the third transistor 70 can be enhanced, and the response capability of the third transistor 70 can be enhanced. It is to be noted that the second transistor 30 and the third transistor 70 may be oxide semiconductor transistors and generally speaking, the volume of the oxide semiconductor transistor is large, so it is beneficial to reducing the volume of the second transistor 30 and the volume of the third transistor 70 by providing the second transistor 30 as a double-gate transistor with a top gate and a bottom gate stacked and the third transistor 70 as a double-gate transistor with a top gate and a bottom gate stacked. Further, the distance D4 between the fourth gate 35 and the second active layer 31 is larger, and the distance D2 between the second gate 32 and the second active layer 31 is larger so that the second active layer 31 is fully protected from being eroded by hydrogen, water and oxygen and the like in the film layer located on the side of the second active layer 31 facing away from the base substrate 10 and the film layer located on the side of the second active layer 31 facing towards the base substrate 10. The distance D5 between the fifth gate 75 and the third active layer 71 is larger, and the distance D2 between the third gate 72 and the third active layer 71 is larger so that the third active layer 71 is fully protected from being eroded by hydrogen, water and oxygen and the like in the film layer located on the side of the third active layer 71 facing away from the base substrate 10 and the film layer located on the side of the third active layer 71 facing towards the base substrate 10.

On the basis of the preceding scheme, optionally, D2<D4, and D3<D5, that is, when a transistor includes two gates, different gates in the same transistor are at different distances from the active layer. Specifically, in the second transistor 30, the second gate 32 is the main gate of the second transistor 30, and the fourth gate 35 is the assist gate of the second transistor 30. The distance D2 between the second gate 32 (main gate) and the second active layer 31 is smaller than the distance D4 between the fourth gate 35 (assist gate) and the second active layer 21, so that the ability of controlling the second transistor 30 by the main gate is ensured. In the third transistor 70, the third gate 72 is the main gate of the third transistor 70, and the fifth gate 75 is the assist gate of the third transistor 70. The distance D3 between the third gate 72 (main gate) and the third active layer 71 is smaller than the distance D5 between the fifth gate 75 (assist gate) and the third active layer 71, so that the ability of controlling the third transistor 70 by the main gate is ensured.

On the basis of the preceding scheme, optionally, the third transistor 70 is a drive transistor of the pixel circuit 60, and (D4−D2)>(D5−D3). That is, the difference between the distance D5 between the fifth gate 75 (assist gate) and the third active layer 71 and the distance D3 between the third gate 72 (main gate) and the third active layer 71 is small, that is, although the distance D5 between the fifth gate 75 (assist gate) and the third active layer 71 is larger than the distance D3 between the third gate 72 (main gate) and the third active layer 71, values of D5 and D3 are very close.

As is known from the preceding content, if the third transistor 70 is the drive transistor of the pixel circuit 60, the subthreshold swing of the drive transistor cannot be too low since the drive transistor undertakes the function of data writing in the pixel circuit 60 and the threshold capture of the drive transistor is involved in the data writing process. Therefore, in this embodiment, the distance D5 between the fifth gate 75 (assist gate) and the third active layer 71 is slightly larger than the distance D3 between the third gate 72 (main gate) and the third active layer 71, so that the ability of controlling the third transistor 70 by the main gate can be ensured, meanwhile the subthreshold swing of the third transistor 70 can be ensured to be large, and the third transistor 70 can be ensured to slowly perform the threshold capture process, thereby improving the performance of the pixel circuit 60.

Figure 10:
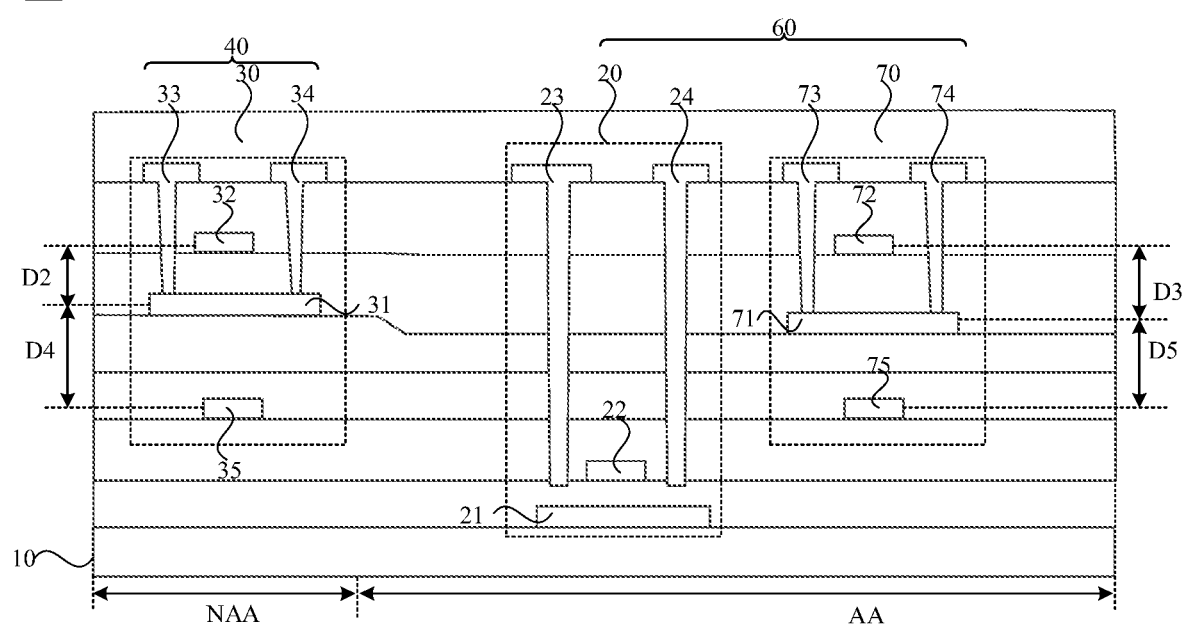
FIG. 10 is a diagram showing structures of a film layer of another display panel according to an embodiment of the present disclosure.

FIG. 10 is a diagram showing structures of a film layer of another display panel according to an embodiment of the present disclosure. On the basis of the preceding scheme, optionally, as shown in FIGS. 10, D3>D2 and D5<D4. When the third transistor 70 is a drive transistor, the distance D3 between the third gate 72 (main gate) and the third active layer 71 is appropriately larger, so that the subthreshold swing of the third transistor 70 is ensured to be large, and the third transistor 70 can be ensured to slowly perform the threshold capture process, thereby improving the performance of the pixel circuit 60.

Similarly, when the second gate 32 and the third gate 72 are located in the same film layer, the second active layer 31 and the third active layer 71 are located in the same layer, the fourth gate 35 and the fifth gate 75 are located in the same film layer, the distance D3 between the third gate 72 (main gate) and the third active layer 71 is different from the distance D2 between the second gate 32 and the second active layer 31, and the distance D5 between the fifth gate 75 (assist gate) and the third active layer 71 is different from the distance D4 between the fourth gate 35 and the second active layer 31, the Halftone Mask technique, for example, may be used to manufacture the insulating layer between the fourth gate 35 and the second active layer 31 and the insulating layer between the second active layer 31 and the second gate 32 so that the thickness of different regions of the insulating layer is different.

Figure 11:
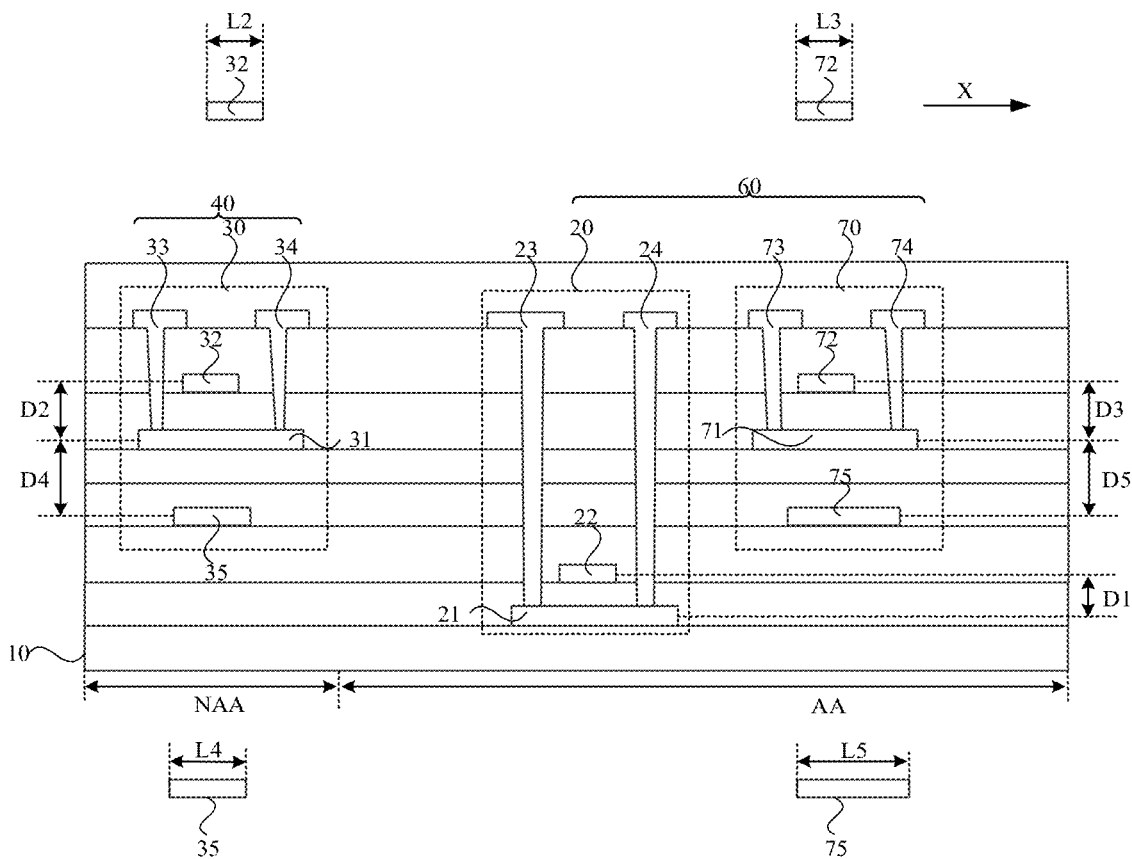
FIG. 11 is a diagram showing structures of a film layer of another display panel according to an embodiment of the present disclosure.

Optionally, FIG. 11 is a diagram showing structures of another display panel according to an embodiment of the present disclosure. As shown in FIG. 11, the third transistor 70 is a drive transistor of the pixel circuit 60, L2 denotes a length of the second gate 32 in a first direction X, L3 denotes a length of the third gate 72 in the first direction X, L4 denotes a length of the fourth gate 35 in the first direction X, and L5 denotes a length of the fifth gate 75 in the first direction X and (L3−L2)<(L5−L4); and the first direction X is a direction pointing from the first source 23 to the first drain 24.

The drive transistor is a core element in the pixel circuit 60. The performance of the drive transistor directly affects a drive current and thus affects the light-emitting effect of the light-emitting element. The difference between the length L5 of the fifth gate 75 in the first direction X and the length L4 of the fourth gate 35 in the first direction X is large, that is, the length L5 of the fifth gate 75 of the drive transistor in the pixel circuit 60 in the first direction X is greater than the length of the fourth gate 35 of the drive circuit 40, so that the fifth gate 75 (the assist gate of the third transistor 70) of the third transistor 30 fully protects the third transistor 70, improving the stability of the third transistor 70, improving the light-emitting effect of the light-emitting element, and further improving the display effect of the display panel 100.

Optionally, with continued reference to FIG. 7, the third transistor 70 includes a switch transistor of the pixel circuit 60. A first insulating layer 80 is disposed between the first gate 22 and the first active layer 21, a second insulating layer 81 is included between the second gate 72 and the second active layer 71, and a third insulating layer 82 is included between the third gate 72 and the third active layer 71. A concentration of hydrogen in the third insulating layer 82 is lower than a concentration of hydrogen in the second insulating layer 81.

The display panel 100 may be used in a case of low-frequency refresh. In the case of low-frequency refresh, a switch transistor in the pixel circuit 60 is turned off for a long time, while a transistor in the drive circuit 40 turns on more frequently. The concentration of hydrogen in the gate insulating layer of the second transistor 30 in the drive circuit 40 is higher than the concentration of hydrogen in the gate insulating layer of the third transistor 70 in the pixel circuit 60, that is, the concentration of hydrogen in the second insulating layer 81 is higher, so that the deficiency in the second insulating layer 81 is repaired, and carriers in the second transistor 30 are prevented from being trapped and affected by the deficiency in the first insulating layer 40, improving the stability of the second transistor 30. In this manner, even if the second transistor 30 in the drive circuit 40 turns on frequently, the overall characteristics of the drive circuit 40 can also be ensured to be good. Optionally, with continued reference to FIG. 7, the third transistor 70 includes a drive transistor of the pixel circuit 60. A first insulating layer 80 is disposed between the first gate 22 and the first active layer 21, a second insulating layer 81 is disposed between the second gate 72 and the second active layer 71, and a third insulating layer 82 is disposed between the third gate 72 and the third active layer 71; and a concentration of hydrogen in the third insulating layer 82 is higher than a concentration of hydrogen in the second insulating layer 81.

When the pixel circuit 60 is applied to the low-frequency driving mode, the drive transistor in the pixel circuit 60 remains in an on state longer than the transistor in the drive circuit 40. The concentration of hydrogen in the gate insulating layer of the third transistor 70 in the pixel circuit 60 is higher than the concentration of hydrogen in the gate insulating layer of the second transistor 30 in the drive circuit 40, that is, the concentration of hydrogen in the third insulating layer 82 is higher, so that the deficiency in the third insulating layer 82 is repaired, and carriers in the third transistor 70 are prevented from being trapped and affected by the deficiency in the third insulating layer 82, improving the stability of the third transistor 70. In this manner, even if the third transistor 70 in the pixel circuit 60 remains in the on state for a long time, the overall characteristics of the pixel circuit 60 can also be ensured to be good. It is to be noted that when the second insulating layer 81 and the third insulating layer 82 are disposed in the same film layer, different concentrations of hydrogen may be implanted into the second insulating layer 81 and the third insulating layer 82 by the ion implantation process so that the concentration of hydrogen in the third insulating layer 82 is higher than the concentration of hydrogen in the second insulating layer 81.

It is to be noted that the preceding concentration, if not specially required, refers to the atomic concentration, that is, the atomic content per unit area.

Figure 12:
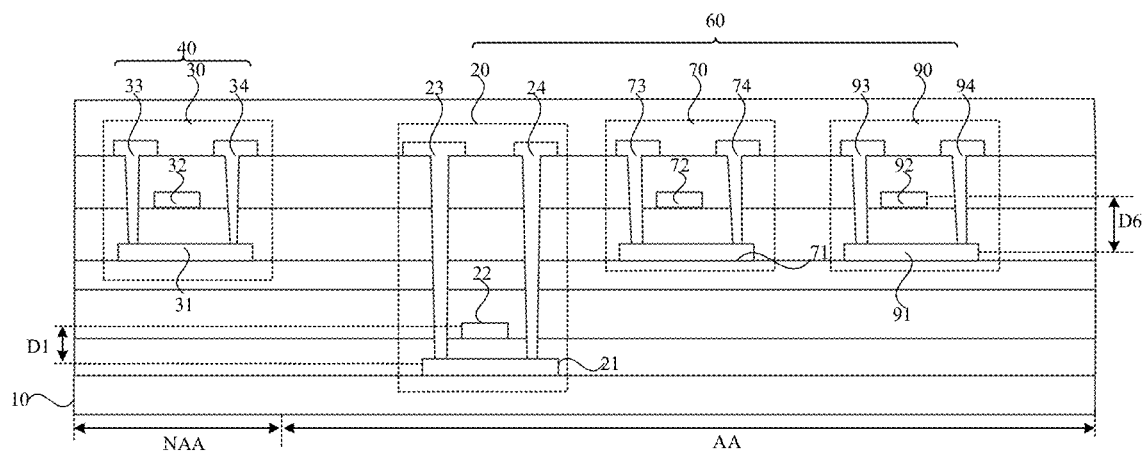
FIG. 12 is a diagram showing structures of a film layer of another display panel according to an embodiment of the present disclosure.

Optionally, FIG. 12 is a diagram showing structures of a film layer of another display panel according to an embodiment of the present disclosure. As shown in FIG. 12, the pixel circuit 60 further includes a fourth transistor 90, the fourth transistor 90 includes a fourth active layer 91, a sixth gate 92, a fourth source 93, and a fourth drain 94, and the fourth active layer 91 contains an oxide semiconductor; and in the direction perpendicular to the base substrate 10, a distance between the sixth gate 92 and the fourth active layer 91 is D6, and D1<D6.

Specifically, the pixel circuit 60 further includes the fourth transistor 90. The fourth active layer 91 in the fourth transistor 90 may also be an oxide semiconductor active layer such as an IGZO active layer. That is, the third transistor 70 and the fourth transistor 90 in the pixel circuit 60 in this embodiment are each an oxide semiconductor transistor, so that the leakage current is low in the working process of the pixel circuit 60, and the performance of the pixel circuit 60 is ensured to be good. Further, in this embodiment, the distance D6 between the sixth gate 92 and the fourth active layer 91 is larger than the distance D1 between the first gate 22 and the first active layer 21. On one hand, the distance between the sixth gate 92 and the fourth active layer 91 is larger, that is, the insulating layer between the sixth gate 92 and the fourth active layer 91 is thicker, so that the fourth active layer 91 is fully protected from being eroded by hydrogen, water and oxygen and the like in the organic film layer located on the side of the fourth active layer 91 facing away from the base substrate 10. On the other hand, the distance between the first gate 22 and the first active layer 21 is smaller, so that the mobility of carriers in the first transistor 20 is increased and the response speed of the first transistor 20 is further improved. That is, in this embodiment, the distance between the first gate 22 and the first active layer 21 is smaller than the distance between the sixth gate 92 and the fourth active layer 91, so that the fourth active layer 91 of the fourth transistor 90 can be fully protected and thus the performance of the fourth transistor 90 is good and meanwhile the migration performance of carriers in the first transistor 20 is ensured. In this manner, when the pixel circuit 60 includes the first transistor 20, the third transistor 70, and the fourth transistor 90, the performance of the pixel circuit 60 is ensured to be good.

It is to be noted that the fourth active layer 91 of the fourth transistor 90, the third active layer 71 of the third transistor 70, and the second active layer 31 of the second transistor 30 are disposed in the same layer; the sixth gate 92 of the fourth transistor 90, the third gate 72 of the third transistor 70, and the second gate 32 of the second transistor 30 are disposed in the same layer; and the fourth source 93 and the fourth drain 94 in the fourth transistor 90, the third source 73 and the third drain 74 in the third transistor 70, the second source 33 and the second drain 34 in the second transistor 30, and the first source 23 and the first drain 24 in the first transistor 20 are disposed in the same layer, thus simplifying the process steps and improving the manufacturing efficiency of the display panel.

Figure 13:
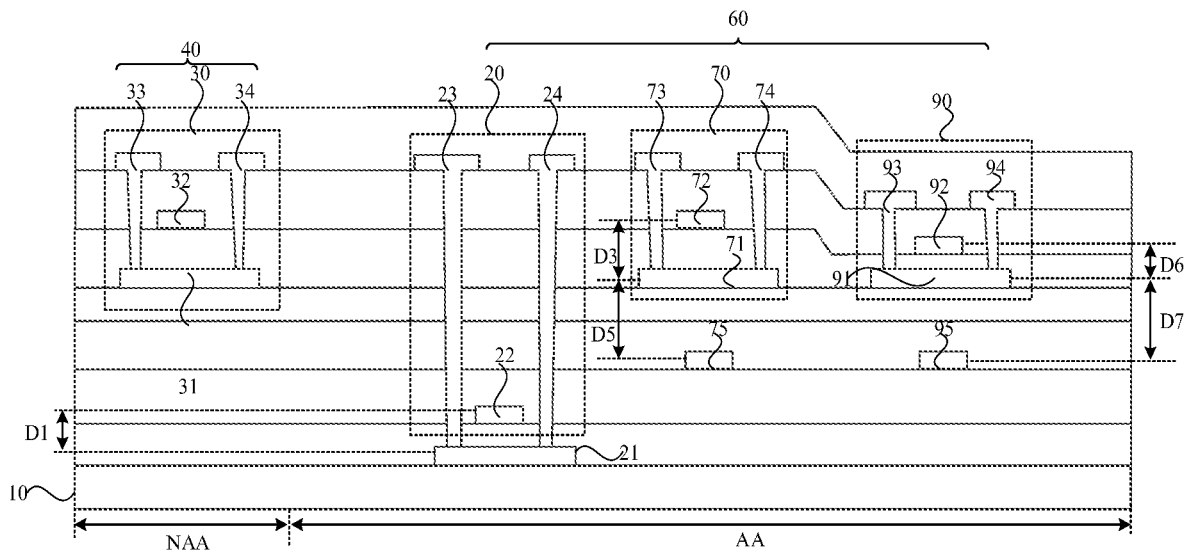
FIG. 13 is a diagram showing structures of a film layer of another display panel according to an embodiment of the present disclosure.

Optionally, FIG. 13 is a diagram showing structures of a film layer of another display panel according to an embodiment of the present disclosure. As shown in FIG. 13, the third transistor 70 is a drive transistor of the pixel circuit 60, the fourth transistor 90 is a switch transistor of the pixel circuit 60, and D3>D6.

In this embodiment, the distance D3 between the third active layer 71 and the third gate 72 is larger to ensure that the subthreshold swing of the third transistor 70 is large. When the third transistor 70 is the drive transistor of the pixel circuit 60, the third transistor 70 can be ensured to slowly perform the threshold capture process, thereby improving the performance of the pixel circuit 60.

Optionally, with continued reference to FIG. 13, the third transistor 70 includes a fifth gate 75, the third gate 72 and the fifth gate 75 are located on two sides of the third active layer 71, respectively; the fourth transistor 90 includes a seventh gate 95, and the sixth gate 92 and the seventh gate 95 are located on two sides of the fourth active layer 91, respectively; and in the direction perpendicular to the base substrate 10, a distance between the fifth gate 75 and the third active layer 71 is D5, a distance between the seventh gate 95 and the fourth active layer 91 is D7, and (D5−D3)<(D7−D6).

That is, the difference between the distance D5 between the fifth gate 75 (assist gate) and the third active layer 71 and the distance D3 between the third gate 72 (main gate) and the third active layer 71 is small, that is, although the distance D5 between the fifth gate 75 (assist gate) and the third active layer 71 is larger than the distance D3 between the third gate 72 (main gate) and the third active layer 71, values of D5 and D3 are very close. That is, the distance D5 between the fifth gate 75 (assist gate) and the third active layer 71 is slightly larger than the distance D3 between the third gate 72 (main gate) and the third active layer 71. Therefore, when the third transistor 70 is used as the drive transistor of the pixel circuit 60, the ability of controlling the third transistor 70 by the main gate can be ensured, meanwhile the subthreshold swing of the third transistor 70 can be ensured to be large, and the third transistor 70 can be ensured to slowly perform the threshold capture process, thereby improving the performance of the pixel circuit 60.

Figure 14:
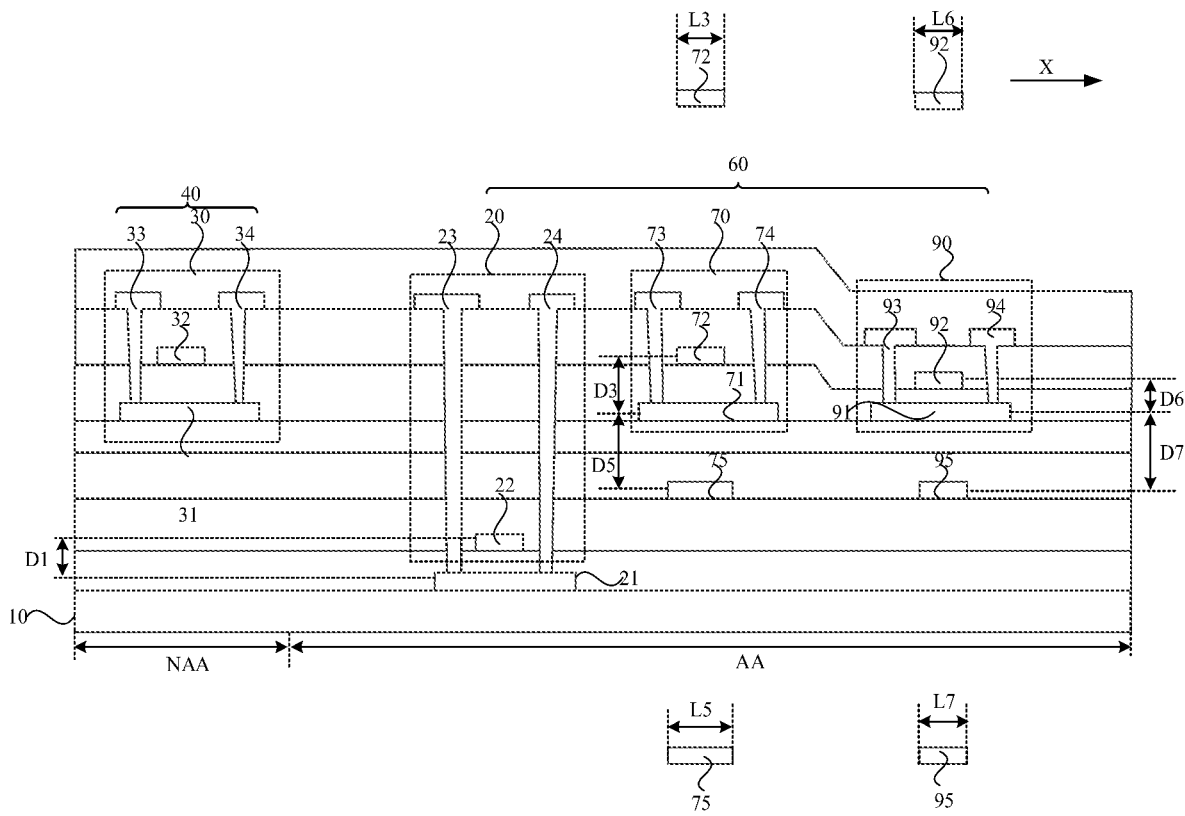
FIG. 14 is a diagram showing structures of a film layer of another display panel according to an embodiment of the present disclosure.

Optionally, FIG. 14 is a diagram showing structures of another display panel according to an embodiment of the present disclosure. As shown in FIG. 14, L3 denotes a length of the third gate 72 in a first direction X, L5 denotes a length of the fifth gate 75 in the first direction X, L6 denotes a length of the sixth gate 92 in the first direction X, L7 denotes a length of the seventh gate 95 in the first direction X is L7, and (L3−L6)<(L5−L7). Where the first direction X is a direction pointing from the first source 23 to the first drain 24.

The drive transistor is a core element in the pixel circuit 60. The performance of the drive transistor directly affects a drive current and thus affects the light-emitting effect of the light-emitting element. The difference between the length L5 of the fifth gate 75 in the first direction X and the length L7 of the seventh gate 95 in the first direction X is large, that is, the length L5 of the fifth gate 75 of the drive transistor in the pixel circuit 60 in the first direction X is greater than the length of the seventh gate 95 of a switch transistor in the pixel circuit 60, so that the fifth gate 75 (the assist gate of the third transistor 70) of the drive transistor fully protects the drive transistor, improving the stability of the drive transistor, improving the light-emitting effect of the light-emitting element, and further improving the display effect of the display panel 100.

Figure 15:
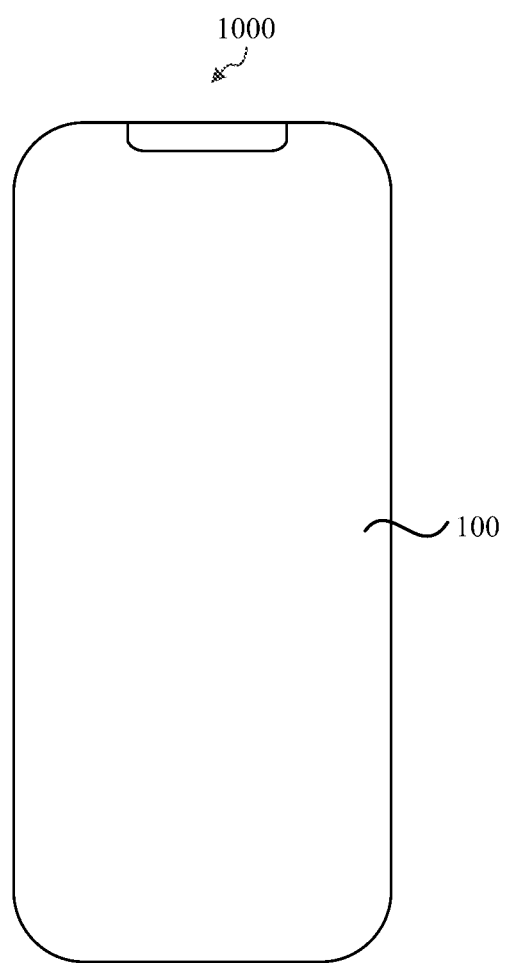
FIG. 15 is a diagram showing structures of a display device according to an embodiment of the present disclosure.

Based on the same inventive concept, a display device is further provided in the embodiments of the present disclosure. The display device includes any display panel provided in the preceding embodiments. Exemplarily, as shown in FIG. 15, a display device 1000 includes the display panel 100. Therefore, the display device also has the beneficial effects of the display panel described in the preceding embodiments, and for the same details, reference may be made to the description of the display panel, and repetition will not made herein.

The display device 1000 provided in the embodiments of the present disclosure may be the phone shown in FIG. 15, or may be any electronic product with a display function, including but not limited to: televisions, laptops, desktop displays, tablet computers, digital cameras, smart bracelets, smart glasses, in-vehicle displays, industry-controlling equipment, medical displays, touch interactive terminals, etc., which will not be specifically limited in the embodiments of the present disclosure.

It is to be noted that the preceding are merely preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
a base substrate; and
a first transistor and a second transistor, wherein the first transistor and the second transistor are formed on the base substrate, the first transistor comprises a first active layer, a first gate, a first source, and a first drain, and the first active layer comprises silicon; the second transistor comprises a second active layer, a second gate, a second source, and a second drain, and the second active layer comprises an oxide semiconductor and is disposed farther away from the base substrate than the first active layer;
wherein the first gate is disposed on top of the first active layer, and the second gate is disposed on top of the second active layer;
wherein, in a first direction perpendicular to the base substrate, a first distance between the first gate and the first active layer is D1, a second distance between the second gate and the second active layer is D2, and D1<D2;
wherein the display panel further comprises a pixel circuit and a drive circuit providing a drive signal for the pixel circuit, wherein the drive circuit comprises the second transistor, and either the pixel circuit comprises the first transistor or the drive circuit comprises the first transistor;
wherein the pixel circuit comprises a third transistor, the third transistor comprises a third active layer, a third gate, a third source, and a third drain, and the third active layer comprises an oxide semiconductor; and
in the direction perpendicular to the base substrate, a third distance between the third gate and the third active layer is D3, and D1<D3;
wherein the second gate is located on one side of the first active layer facing away from the base substrate, and the third gate is disposed on one side of the third active layer facing away from the base substrate;
the second transistor comprises a fourth gate, the third transistor comprises a fifth gate, the fourth gate is disposed on one side of the second active layer facing towards the base substrate, and the fifth gate is disposed on one side of the third active layer facing towards the base substrate; and
in the first direction perpendicular to the base substrate, a fourth distance between the fourth gate and the second active layer is D4, a fifth distance between the fifth gate and the third active layer is D5, D1<D4, and D1<D5;
wherein D2<D4 and D3<D5, the third transistor is a drive transistor of the pixel circuit, a second length of the second gate in a second direction is L2, a third length of the third gate in the second direction is L3, a fourth length of the fourth gate in the second direction is L4, and a fifth length of the fifth gate in the second direction is L5;

$$(L3-L2)<(L5-L4); \text{ and}$$

the second direction is a direction pointing from the first source to the first drain.

2. The display panel of claim 1, wherein
the drive circuit comprises an input module, a logic transmission module, and an output module, the input module is connected between an input terminal and the logic transmission module, and the output module is connected between the logic transmission module and an output terminal;
the logic transmission module is connected to a logic high-level signal terminal or a logic low-level signal terminal, and the output terminal is connected to the pixel circuit; and
the output module comprises the first transistor and either the logic transmission module comprises the second transistor or the input module comprises the second transistor.

3. The display panel of claim 2, wherein
a first width of a first channel region of the first transistor is W1, a second width of a second channel region of the second transistor is W2, a first length of the first channel region of the first transistor is L1, and a second length of the second channel region of the second transistor is L2; and
a first width-to-length ratio of the first transistor is R1=W1/L1, a second width-to-length ratio of the second transistor is R2=W2/L2, and R1/R2≥D1/D2.

4. The display panel of claim 1, wherein
a first width of a first channel region of the first transistor is W1, a second width of a second channel region of the second transistor is W2, a first length of the first channel region of the first transistor is L1, a second length of the second channel region of the second transistor is L2, and W1/L1≤W2/L2.

5. The display panel of claim 4, wherein
a first width-to-length ratio of the first transistor is R1=W1/L1, a second width-to-length ratio of the second transistor is R2=W2/L2, and R1/R2≤D1/D2;
the drive circuit comprises an input module, a logic transmission module, and an output module, the input module is connected between an input terminal and the logic transmission module, and the output module is connected between the logic transmission module and an output terminal;
the output terminal is connected to the pixel circuit, and either the logic transmission module is connected to a logic high-level signal terminal or a logic low-level signal terminal; and
the output module comprises the second transistor.

6. The display panel of claim 1, wherein
the third transistor is a switch transistor of the pixel circuit, and D2≤D3.

7. The display panel of claim 1, wherein
the third transistor is a drive transistor of the pixel circuit, and D2<D3.

8. The display panel of claim 1, wherein
the third transistor is a drive transistor of the pixel circuit, and $$(D4-D2)>(D5-D3).$$

9. The display panel of claim 8, wherein D3>D2 and D5<D4.

10. The display panel of claim 1, further comprising: a first insulating layer, a second insulating layer and a third insulating layer, wherein
the first insulating layer is disposed between the first gate and the first active layer,
the second insulating layer is disposed between the second gate and the second active layer, and
a third insulating layer is disposed between the third gate and the third active layer; and
a first concentration of hydrogen in the third insulating layer is higher than a second concentration of hydrogen in the second insulating layer.

11. The display panel of claim 1, wherein
the pixel circuit further comprises a fourth transistor, the fourth transistor comprises a fourth active layer, a sixth gate, a fourth source, and a fourth drain, and the fourth active layer comprises an oxide semiconductor; and
in the first direction perpendicular to the base substrate, a sixth distance between the sixth gate and the fourth active layer is D6, and D1<D6.

12. The display panel of claim 11, wherein
the third transistor is a drive transistor of the pixel circuit, the fourth transistor is a switch transistor of the pixel circuit, and D3>D6.

13. The display panel of claim 12, wherein
the third transistor comprises a fifth gate, the third gate and the fifth gate are located on two sides of the third active layer, respectively; the fourth transistor comprises a seventh gate, and the sixth gate and the seventh gate are located on two sides of the fourth active layer, respectively; and
in the first direction perpendicular to the base substrate, a fifth distance between the fifth gate and the third active layer is D5, a seventh distance between the seventh gate and the fourth active layer is D7, and (D5−D3)<(D7−D6).

14. The display panel of claim 13, wherein
a third length of the third gate in a second direction is L3, a fifth length of the fifth gate in the second direction is L5, a sixth length of the sixth gate in the second direction is L6, a seventh length of the seventh gate in the second direction is L7, and (L3−L6)< (L5−L7); and
the second direction is a direction pointing from the first source to the first drain.

15. A display device, comprising a display panel, wherein the display panel comprises:
a base substrate; and
a first transistor and a second transistor, wherein the first transistor and the second transistor are formed on the base substrate, the first transistor comprises a first active layer, a first gate, a first source, and a first drain, and the first active layer comprises silicon; the second transistor comprises a second active layer, a second gate, a second source, and a second drain, and the second active layer comprises an oxide semiconductor and is disposed farther away from the base substrate than the first active layer;
wherein the first gate is disposed on top of the first active layer, and the second gate is disposed on top of the second active layer;
wherein in a first direction perpendicular to the base substrate, a first distance between the first gate and the first active layer is D1, a second distance between the second gate and the second active layer is D2, and D1<D2;
wherein the display panel further comprises a pixel circuit and a drive circuit providing a drive signal for the pixel circuit, wherein the drive circuit comprises the second transistor, and the pixel circuit comprises the first transistor or the drive circuit comprises the first transistor;

wherein the pixel circuit comprises a third transistor, the third transistor comprises a third active layer, a third gate, a third source, and a third drain, and the third active layer comprises an oxide semiconductor; and in the direction perpendicular to the base substrate, a third distance between the third gate and the third active layer is D3, and D1<D3;

wherein the second gate is located on one side of the first active layer facing away from the base substrate, and the third gate is disposed on one side of the third active layer facing away from the base substrate;

the second transistor comprises a fourth gate, the third transistor comprises a fifth gate, the fourth gate is disposed on one side of the second active layer facing towards the base substrate, and the fifth gate is disposed on one side of the third active layer facing towards the base substrate; and in the first direction perpendicular to the base substrate, a fourth distance between the fourth gate and the second active layer is D4, a fifth distance between the fifth gate and the third active layer is D5, D1<D4, and D1<D5;

wherein D2<D4 and D3<D5, the third transistor is a drive transistor of the pixel circuit, a second length of the second gate in a second direction is L2, a third length of the third gate in the second direction is L3, a fourth length of the fourth gate in the second direction is L4, and a fifth length of the fifth gate in the second direction is L5;

(L3−L2)<(L5−L4); and the second direction is a direction pointing from the first source to the first drain.

\* \* \* \* \*